(12) United States Patent
Yeh

(10) Patent No.: US 7,336,831 B2
(45) Date of Patent: Feb. 26, 2008

(54) METHOD AND APPARATUS OF RECORDING COMPRESSION ENCODING TABLES IN A PSEUDO READ-ONLY MEMORY

(75) Inventor: Chia-yow Yeh, Changhua (TW)

(73) Assignee: Cheerteck, Inc. (TW)

( * ) Notice: Subject to any disclaimer, the term of this patent is extended or adjusted under 35 U.S.C. 154(b) by 989 days.

(21) Appl. No.: 10/617,492

(22) Filed: Jul. 10, 2003

(65) Prior Publication Data

US 2004/0139090 A1    Jul. 15, 2004

(30) Foreign Application Priority Data

Jan. 15, 2003    (TW) .............................. 92100837 A

(51) Int. Cl.
G06K 9/36    (2006.01)
(52) U.S. Cl. ..................................... 382/232
(58) Field of Classification Search ........ 382/232–253; 375/240–240.27; 358/426.01–426.16; 341/59, 341/65, 67, 104
See application file for complete search history.

(56) References Cited

U.S. PATENT DOCUMENTS 5,832,128 A * 11/1998 Suzuki ........................ 382/246
6,643,408 B2 * 11/2003 Kobayashi .................. 382/250
6,900,747 B2 * 5/2005 Lee ............................. 341/106

* cited by examiner

Primary Examiner—Ishrat Sherali
(74) Attorney, Agent, or Firm—Martine Penilla & Gencarella, LLP

(57) ABSTRACT

An apparatus includes a pseudo address decoder, a programmable logic array, a corresponding value calculation module, a storage element, a subtracter, and a multiplexer. The pseudo address decoder determines a block corresponding to an index of the compression encoding table. The programmable logic array calculates related data of the block determined by the pseudo address decoder. The corresponding value calculation module calculates the corresponding value in accordance with the related data of the block. Non-repeating or non-increasing data of the compression encoding table are stored in the storage element. The subtracter outputs a difference between the index and the address offset in order to read the storage element. The multiplexer selectively outputs the output values calculated by the corresponding value calculation module or the data read from the storage element.

13 Claims, 5 Drawing Sheets

|       | Index2 | Index | \|Level\| | Zero Run | Symbol Value | Symbol Length |
|-------|--------|-------|-----------|----------|--------------|---------------|
|       | 0      | 388   | 9         | 0        | 404          | 9             |
|       | 1      | 389   | 9         | 1        | 4064         | 12            |
|       | 2      | 390   | 9         | 2        | 16147        | 14            |
|       | 3      | 391   | 9         | 3        | 29835        | 16            |
| B1    | 4      | 392   | 9         | 4        | 61590        | 16            |
|       | 5      | 393   | 9         | 5        | 53120        | 16            |
|       | 6      | 394   | 9         | 6        | 123486       | 17            |
|       | 7      | 395   | 9         | 7        | 927165       | 21            |
|       | 8      | 396   | 9         | 8        | 212321       | 18            |
|       | 9      | 397   | 9         | 9        | 93233        | 17            |
|       | 10     | 398   | 10        | 0        | 505          | 9             |
|       | 11     | 399   | 10        | 1        | 6418         | 13            |
| B2    | 12     | 400   | 10        | 2        | 22288        | 15            |
|       | 13     | 401   | 10        | 3        | 62416        | 16            |
|       | 14     | 402   | 10        | 4        | 49599        | 16            |
|       | 15     | 403   | 11        | 0        | 769          | 10            |
| B3    | 16     | 404   | 11        | 1        | 7716         | 13            |
|       | 17     | 405   | 11        | 2        | 44296        | 16            |
| B4    | 18     | 406   | 12        | 0        | 973          | 10            |

Fig. 5

METHOD AND APPARATUS OF RECORDING COMPRESSION ENCODING TABLES IN A PSEUDO READ-ONLY MEMORY

BACKGROUND OF THE INVENTION

1. Field of the Invention

The invention relates to a method and apparatus of recording compression encoding tables and, more particularly, to a method and apparatus of recording compression encoding tables in a pseudo read-only memory.

2. Description of the Related Art

Given the great progress made in information technology, users nowadays may store nearly any kind of data in a digital manner. In addition, owing to the rapid development of the Internet, users of today may send, and exchange, data via the Internet. However, despite the dramatic improvements in them, the data-storage technology and the network technology are often inadequate to cope with the ever-increasing data. For instance, data of images and sounds are so voluminous that it takes considerable storage space and the network bandwidth to directly store or transmit image data or sound data on the Internet. Hence, data nowadays are mostly stored by means of compression encoding in order to minimize data without deteriorating the audiovisual quality, for the sake of saving storage space and the network bandwidth.

Take audiovisual data as an example, MPEG (Motion Picture Experts Group), MP3 (MPEG Audio Layer 3), and WMA (Windows Media Audio) are the video, audio compression formats popular with users of today, thus video data and audio data are transmitted on the Internet in these file formats. It is necessary to decode whatever audiovisual data processed previously by compression encoding when the audiovisual data is to be read or played. The decoding process can be executed by either software or hardware. However, it is the central processing unit (CPU) of the system that will execute the whole decoding operation whenever the decoding process is executed by software. The drawback is that, if the system is inefficient, audiovisual quality will worsen, leading to playing troubles, such as video frame skipping or audio unevenness. Conversely, such a problem is uncommon during the decoding process executed by hardware.

It is necessary to record the corresponding compression encoding tables to ensure that the decoding process yields data consistent with the previously compression-encoded data regardless of executing compression encoding or decoding by software or hardware. If the decoding process is to be executed by hardware, it will be feasible to store the compression encoding tables in a read-only memory (ROM) as well as to read their data for the sake of decoding. For instance, the compression of audio data in a WMA format involves using six types of compression encoding tables, namely huffman-RLC-16-mono, huffman-RLC-16-diff, huffman-RLC-440-mono, huffman-RLC-440-diff, huffman-RLC-44Q-mono, and huffman-RLC-44Q-diff. It requires a total of 4438×16 bits to store these compression encoding tables in the read-only memory. As regards practical integrated circuits, these compression encoding tables occupy a relatively large area of a silicon chip, making the integrated circuits large and increasing the cost of raw materials.

In short, the problem that should be addressed urgently is that the aforesaid compression encoding tables should be efficiently recorded in a read-only memory, so as to reduce the area of the silicon chip for storing the compression encoding tables and thus cut down the raw material cost.

SUMMARY OF THE INVENTION

In view of the above-mentioned problems, an object of the invention is to provide a method and apparatus of recording compression encoding tables in a pseudo read-only memory so as to efficiently reduce the memory required for storage of compression encoding tables.

Another object of this invention is to provide a method and apparatus of recording compression encoding tables in a pseudo read-only memory so as to efficiently reduce the silicon chip area required for a decoding integrated circuit and thus cut down the raw material cost.

In order to achieve the above objects, a method of recording compression encoding tables in a pseudo read-only memory according to the invention involves the following steps. Divide the repeating or increasing data of a compression encoding table into a plurality of blocks. Indicate each block with a repeat symbol or an increase symbol. Calculate and output the actual data values of the blocks corresponding to the compression encoding table by a logic circuit. Store the non-repeating or non-increasing data of the compression encoding table in another storage element.

An apparatus of recording compression encoding tables in a pseudo read-only memory according to the invention includes a pseudo address decoder, a programmable logic array, and a corresponding value calculation module. By the index of the compression encoding table, the pseudo address decoder determines the block of the compression encoding table, to which the index corresponds, then the pseudo address decoder generates the corresponding output values for the programmable logic array. Based on the block located by the index, i.e., the value output by the pseudo address decoder, the programmable logic array calculates the data relevant to the block located by the index; and such data include the data count of all the blocks that precede the located block, the symbol properties of the located block, and the block initial value. The corresponding value calculation module calculates and outputs the actual data values corresponding to the index, in accordance with the data count, block initial value and symbol properties.

The apparatus of recording compression encoding tables in a pseudo read-only memory according to the invention further includes a storage element, a subtracter, and a multiplexer. Non-repeating or non-increasing data of the compression encoding tables are stored in the storage element. The subtracter computes the difference between the index and the address offset in order to read the storage element. The multiplexer selectively outputs the output values calculated by the corresponding value calculation module or the data read from the storage element.

Given the method and apparatus of recording compression encoding tables in a pseudo read-only memory according to the invention, it is feasible to calculate the corresponding actual values of most of the repeating or increasing data of the compression encoding tables by a logic circuit while non-repeating or non-increasing data of the compression encoding tables are stored in a read-only memory. Hence, the invention has the advantage of reducing efficiently the read-only memory required for storage of compression encoding tables, which, in turn, decreases the area of silicon chip in integrated circuit fabrication and thus cuts the manufacturing cost.

BRIEF DESCRIPTION OF THE DRAWINGS

The above-mentioned and other objects, features, and advantages of the present invention will become apparent with reference to the following descriptions and accompanying drawings, wherein:

FIG. 5 is a table showing part of a huffman-RLC-16-mono compression encoding table.

DETAILED DESCRIPTION OF THE PREFERRED EMBODIMENTS

Figure 1:
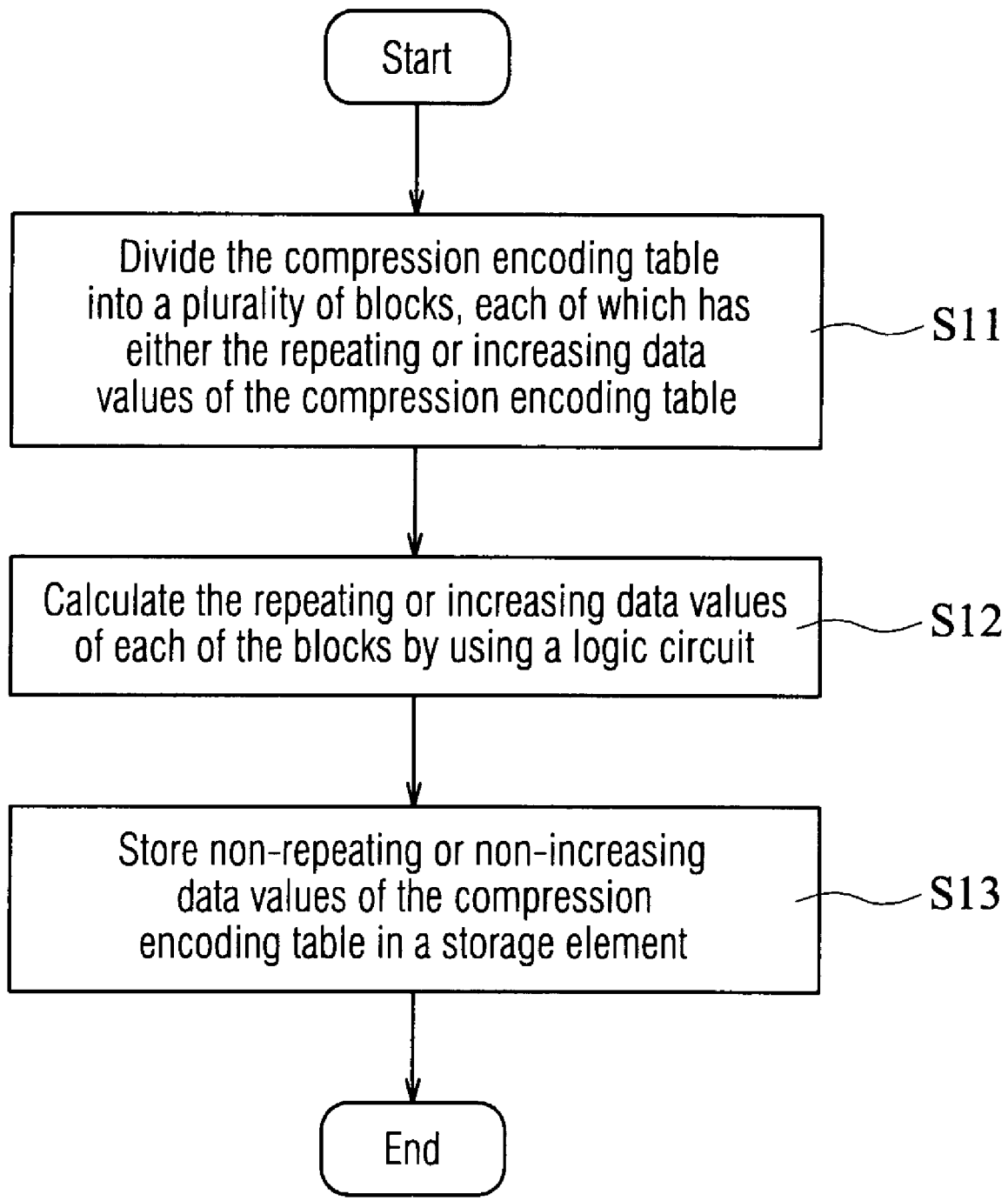
FIG. 1 is a flow chart showing steps of a method of recording compression encoding tables in a pseudo read-only memory according to a preferred embodiment of the invention.

A method and system apparatus of recording compression encoding tables in a pseudo read-only memory according to embodiments of the invention will be described with reference to the accompanying drawings. In the accompanying drawings, similar elements will be denoted with similar reference symbols.

FIG. 5 is a table showing part of a huffman-RLC-16-mono compression encoding table with indexes between 388 and 406. Using FIG. 5 to simulate a compression encoding table, each of the indexes are newly assigned a number starting from 0 (as shown by the field Index2 in FIG. 5) with an increment of 1 for the purposes of illustrating the method of recording a compression encoding table in a pseudo read-only memory according to the invention. Unless otherwise specified in the following description, all of the indexes refer to the newly assigned numbers. As shown in FIG. 5, the field |Level| has repeating values whereas the field Zero Run has increasing values. For instance, for those data whose indexes range from 0 to 9, the corresponding values of the field |Level| are always 9 while the corresponding values of the field Zero Run increase from 0 to 9. For those data whose indexes range from 10 to 14, the corresponding values of the field |Level| are always 10 while the corresponding values of the field Zero Run increase from 0 to 4.

According to the aforesaid rules, FIG. 5 is divided into four blocks that contain data with the indexes from 0 to 9 (B1), from 10 to 14 (B2), from 15 to 17 (B3), and 18 (B4) for the last one, respectively. The values of the field |Level| of each of the four blocks are denoted by a repeat symbol <REP, $LEVEL_{REP}$, $COUNT_{REP}$> wherein REP indicates the repeating feature of the repeat symbol, $LEVEL_{REP}$ denotes the repeating data values in the block, and $COUNT_{REP}$ denotes the data count of the block. Hence, the values of the field |Level| of the four above-mentioned blocks are denoted by <REP, 9, 10>, <REP, 10, 5>, <REP, 11, 3>, and <REP, 12, 1>, respectively. Similarly, the values of the field Zero Run of each of the four blocks are denoted by an increase symbol <INC, $LEVEL_{INC}$, $COUNT_{INC}$> wherein INC indicates the increasing feature of the increase symbol, $LEVEL_{INC}$ denotes the initial value for the increasing data values in the block, and $COUNT_{INC}$ denotes the data count of the block. The values of the field Zero Run of the four above-mentioned blocks are therefore denoted by <INC, 0, 10>, <INC, 0, 5>, <INC, 0, 3>, and <INC, 0, 1>, respectively.

The values of the field |Level| in FIG. 5 are can be determined by identifying the block in which the index is located. For example, if the index 16 is located in the block B3 and the repeat symbol of the field |Level| is <REP, 11, 3>, then the value of the field |Level| is 11. On the other hand, the values of the field Zero Run can be determined by the following equation:

$$VALUE_{INC} = INDEX - SUM_{COUNT} + LEVEL \qquad (a)$$

wherein $VALUE_{INC}$ denotes the value of the field Zero Run, INDEX denotes the index, $SUM_{COUNT}$ denotes the data count of all the blocks that precede the located block, and LEVEL denotes the $LEVEL_{INC}$ value of the increase symbol. Fore example, the index 16 is located in the block B3 and therefore $SUM_{COUNT}$ representing the sum of the data count of the block B1 and the data count of the block B2 is 15. The increase symbol for the value of the field Zero Run is represented by <INC, 0, 3> wherein the LEVEL value is 0. As a result, $VALUE_{INC}$, the value of the field Zero Run, for the index 16 is equal to 1 (as 16−15+0).

Determining which block the given index is located and calculating the value of the compression encoding table corresponding to the index, as described above, can be performed by a logic circuit to be described in detail later. Besides, the content of the block B4 can be directly stored in a storage element since the block B4 has only one data count. Upon compression encoding or decoding, the storage element are directly accessed in accordance with the index to get the actual values of the block B4.

FIG. 1 is a flow chart showing steps of a method of recording compression encoding tables in a pseudo read-only memory according to a preferred embodiment of the invention. At first, the compression encoding table is divided into a plurality of blocks, each of which contains either the repeating data or the increasing data (S11). Next, the actual values of the compression encoding table with respect to the blocks are calculated by the logic circuit (S12). The neither repeating nor increasing data of the compression encoding table are stored in the storage element (S13).

Figure 2:
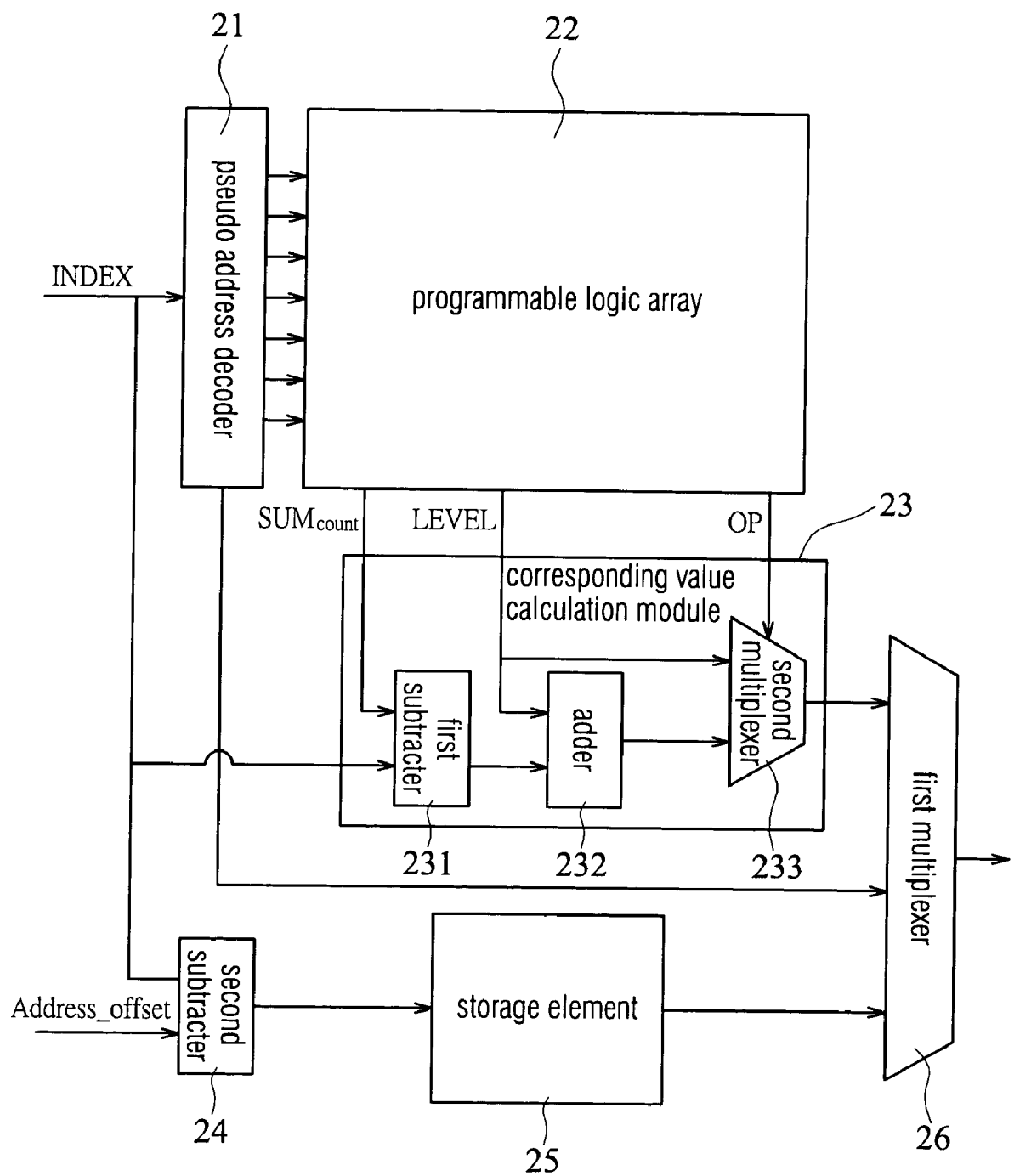
FIG. 2 is a schematic diagram showing an apparatus of recording compression encoding tables in a pseudo read-only memory according to a preferred embodiment of the invention.

FIG. 2 is a schematic diagram showing an apparatus of recording compression encoding tables in a pseudo read-only memory according to a preferred embodiment of the invention. As shown in FIG. 2, the apparatus of recording compression encoding tables in a pseudo read-only memory includes a pseudo address decoder 21, a programmable logic array 22, and a corresponding value calculation module 23. By the index INDEX, the pseudo address decoder 21 identifies the block of the compression encoding table, to which the index INDEX corresponds, and generates the corresponding output values for the programmable logic array 22. Based on the block in which the index INDEX is located, i.e., the value output by the pseudo address decoder 21, the programmable logic array 22 calculates the related data of the located block including the data count of all the blocks that precede the located block, the symbol property OP (including the repeating feature REP and the increasing feature INC) of the located block, the repeating value of the repeat symbol, or the initial value of the increase symbol (hereinafter referred to as the block initial value LEVEL). The corresponding value calculation module 23 calculates and outputs the actual value of the compression encoding table corresponding to the index INDEX on the basis of the total data count $SUM_{COUNT}$, the block initial value LEVEL, and the symbol property OP. If the symbol property OP is REP, i.e., a repeat symbol, then the corresponding actual value is the block initial value LEVEL, i.e., the actual value of the field |LEVEL| in FIG. 5. If the symbol property OP is INC, i.e., an increase symbol, then the corresponding actual value can be calculated by Equation (a). The $VALUE_{INC}$ in Equation (a) is the actual value of the field Zero Run in FIG. 5. The index INDEX substitutes for the INDEX in Equation (a). The total data count $SUM_{COUNT}$ output by the programmable logic array 22 substitutes the $SUM_{COUNT}$ in equation (a). The block initial value LEVEL substitutes the LEVEL in Equation (a). Hence, the corresponding value of the field |LEVEL| and the corresponding value of the field Zero Run can be obtained by inputting an index INDEX.

According to Equation (a), the corresponding value calculation module 23 includes a first subtracter 231, an adder 232, and a second multiplexer 233. The first subtracter 231 calculates the difference between the index INDEX and the total data count $SUM_{COUNT}$, and outputs the difference to the adder 232. The adder 232 calculates the sum of the output value of the first subtracter 231 and the block initial value LEVEL, and outputs the sum to the second multiplexer 233. The second multiplexer 233 selectively outputs the block initial value LEVEL or the output value of the adder 232 on the basis of the symbol property OP. If the symbol property OP is REP, then the second multiplexer 233 outputs the block initial value LEVEL. If the symbol property OP is INC, then the second multiplexer 233 outputs the output value of the adder 232.

Figure 3:
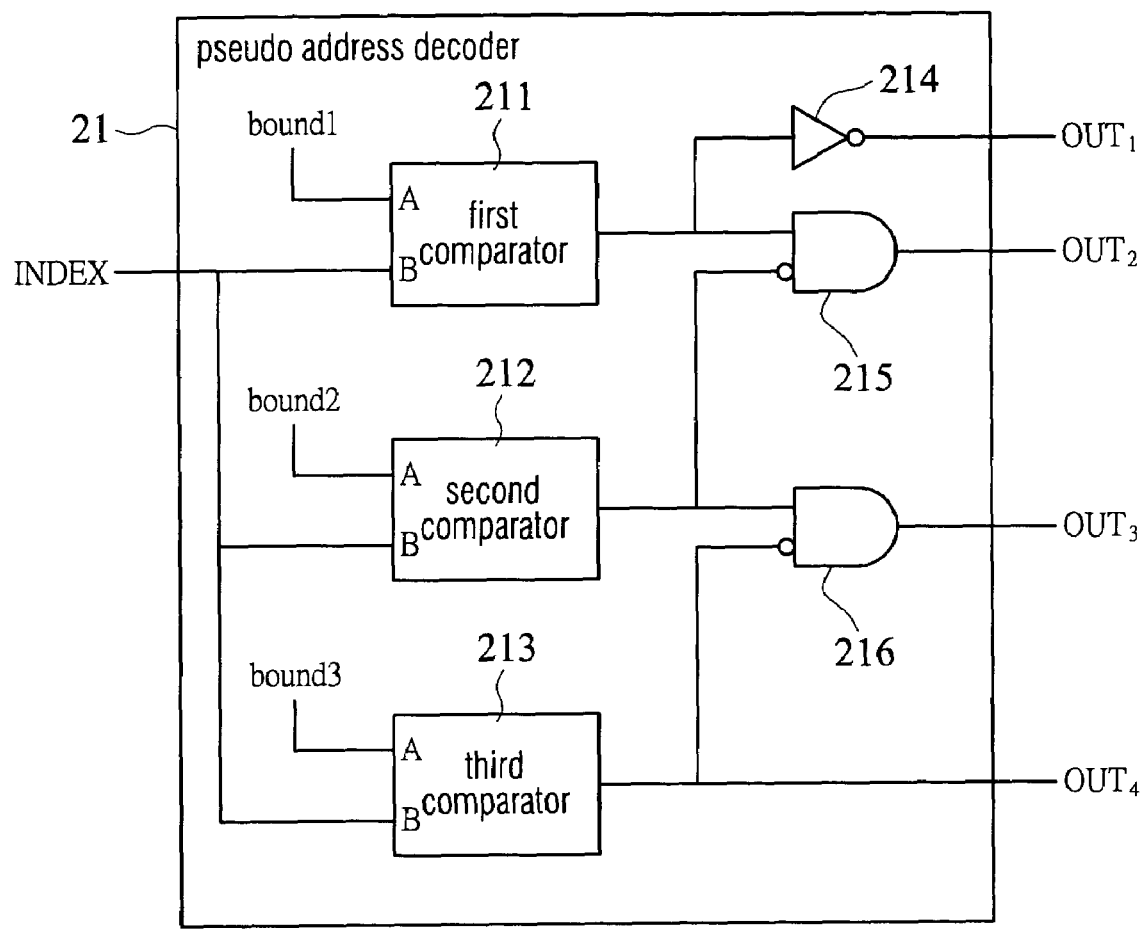
FIG. 3 is a circuit diagram showing one example of a pseudo address decoder of an apparatus of recording compression encoding tables in a pseudo read-only memory according to a preferred embodiment of the invention.

The pseudo address decoder 21 is essentially composed of a series of comparators. Take the compression encoding table of FIG. 5 as an example, the pseudo address decoder 21 includes a first comparator 211, a second comparator 212, a third comparator 213, an inverter 214, a first AND gate 215, and a second AND gate 216 as shown in FIG. 3. Terminals B of the first comparator 211, the second comparator 212, and the third comparator 213 receive the index INDEX while each of terminals A of the comparators receives an individual bound value of each of the four blocks, i.e. the maximum index INDEX of each of the four blocks. For example, the terminal A of the first comparator 211 receives a bound value bound1 of the first block, which is equal to 9. The terminal A of the second comparator 212 receives a bound value bound2 of the second block, which is equal to 14. The terminal A of the third comparator 213 receives a bound value bound3 of the third block, which is equal to 17. If the input to the terminal B of a comparator is greater than the input to the terminal A of the comparator, then the comparator outputs a value of 1, otherwise outputs a value of 0. The output of the first comparator is inverted by the inverter 214 and then becomes a first output value $OUT_1$. As regards the first AND gate 215, one of its two input terminals receives the output of the first comparator 211 while the other input terminal receives the inverted output of the second comparator 212 so as to output a second output value $OUT_2$. As regards the second AND gate 216, one of its two input terminals receives the output of the second comparator 212 while the other input terminal receives the inverted output of the third comparator 213 so as to output a third output value $OUT_3$. The output of the third comparator 213 is used as the fourth output value $OUT_4$. When an index INDEX is input, the pseudo address decoder 21 determines the block in which the index INDEX is located through the comparators and displays in the variations of its output values.

As mentioned above, the non-repeating or non-increasing data of the block B4 in FIG. 5 are stored in the storage element 25. The preferred embodiment involves not only a read-only memory, but also a first multiplexer 26, which selectively outputs either the output values of the corresponding value calculation module 23 or the data read from the storage element 25. If the block in which the index INDEX is located is found, by the pseudo address decoder 21, to be beyond the scope of the blocks of the programmable logic array 22, the data values in the storage element 25 corresponding to INDEX is read. It is the output from the pseudo address decoder 21 to the multiplexer 26 that determines the data values are from the programmable logic array 22 or from the storage element 25. Data can be retrieved from the read-only memory by calculating and outputting the difference between the index INDEX and an address offset Address_offset with a second subtracter 24.

Take the compression encoding table of FIG. 5 as an example, a method of obtaining the values of the compression encoding table by the index INDEX is described. The data in the block B1, the block B2, and the block B3 in FIG. 5 may be calculated by the programmable logic array 22 while the block B4 is stored in the storage element 25, i.e., the read-only memory. Therefore, the fourth output value $OUT_4$ of the pseudo address decoder 21 is connected to the first multiplexer 26.

Assume the index INDEX input to the pseudo address decoder 21 is equal to 16, both the output values of the first comparator 211 and the second comparator 212 are 1, and the output value of the third comparator 213 is 0. Therefore, the first output value $OUT_1$, the second output value $OUT_2$, and the fourth output value $OUT_4$ are all equal to 0 but the third output value $OUT_3$ is equal to 1. Hence, the data with an index INDEX of 16 belong to the block B3. The programmable logic array 22 calculates and outputs the related data of the block B3. As calculating the value of the field |Level|, the output symbol property OP is REP, the data count $SUM_{COUNT}$ is 15, and the block initial value LEVEL is 11. As calculating the value of the field Zero Run, the output symbol property OP is INC, the data count $SUM_{COUNT}$ is 15, and the block initial value LEVEL is 0. The corresponding value calculation module 23 calculates the actual data values on the basis of the output values of the programmable logic array 22. To calculate the value of the field |Level|, a block initial value LEVEL of 11 is output. According to Equation (a), the value of the field Zero Run is 1. The first multiplexer 26 determines and outputs the output values of the corresponding value calculation module 23 on the basis of the fourth output value $OUT_4$ of 0 output by the pseudo address decoder 21.

Another example in which the input index INDEX is beyond the scope of the blocks of the programmable logic array 22 is described as follows. When the index INDEX input to the pseudo address decoder 21 is equal to 18, the output values of the first comparator 211, the second comparator 212, and the third comparator 213 are all equal to 1. Therefore, the first output value $OUT_1$, the second output value $OUT_2$, and the third output value $OUT_3$ are all equal to 0 but the fourth output value $OUT_4$ is equal to 1. Hence, the data with an index INDEX of 18 belong to the block B4. The first multiplexer 26 determines to output the data read from the read-only memory on the basis of the fourth output value $OUT_4$ of 1 output by the pseudo address decoder 21.

The apparatus of recording compression encoding tables in a pseudo read-only memory according to the invention has an advantage of efficiently saving space of the storage element necessary for storing the compression encoding tables. For instance, the data count of a complete huffman-RLC-16-mono compression encoding table is 476, wherein the 272 data with the indexes from 2 to 273 may be denoted by <REP, 1, 113>, <REP, 2, 68>, <REP, 3, 49>, <REP, 4, 42> as well as <INC, 0, 113>, <INC, 0, 68>, <INC, 0, 49> and <INC, 0, 42>. In addition, the data of the compression encoding table may be simulated by the logic circuit and the programmable logic array. As regards the six types of compression encoding tables required for compression of audio data on a WMA format, a gate count between 600 and 700 is common in the simulation of the data of the compression encoding tables by processing the repeat symbols and the increase symbols of the compression encoding tables with a logic circuit and a programmable logic array. The remaining data are stored in a read-only memory of about 721×13 bits, as compared to the previously requisite 4438× 16 bits of memory, indicating a 13% reduction in memory. Therefore, the invention certainly reduces the memory required for storing compression encoding tables in a storage element in an efficient manner and thus lowers the manufacturing cost.

Figure 4:
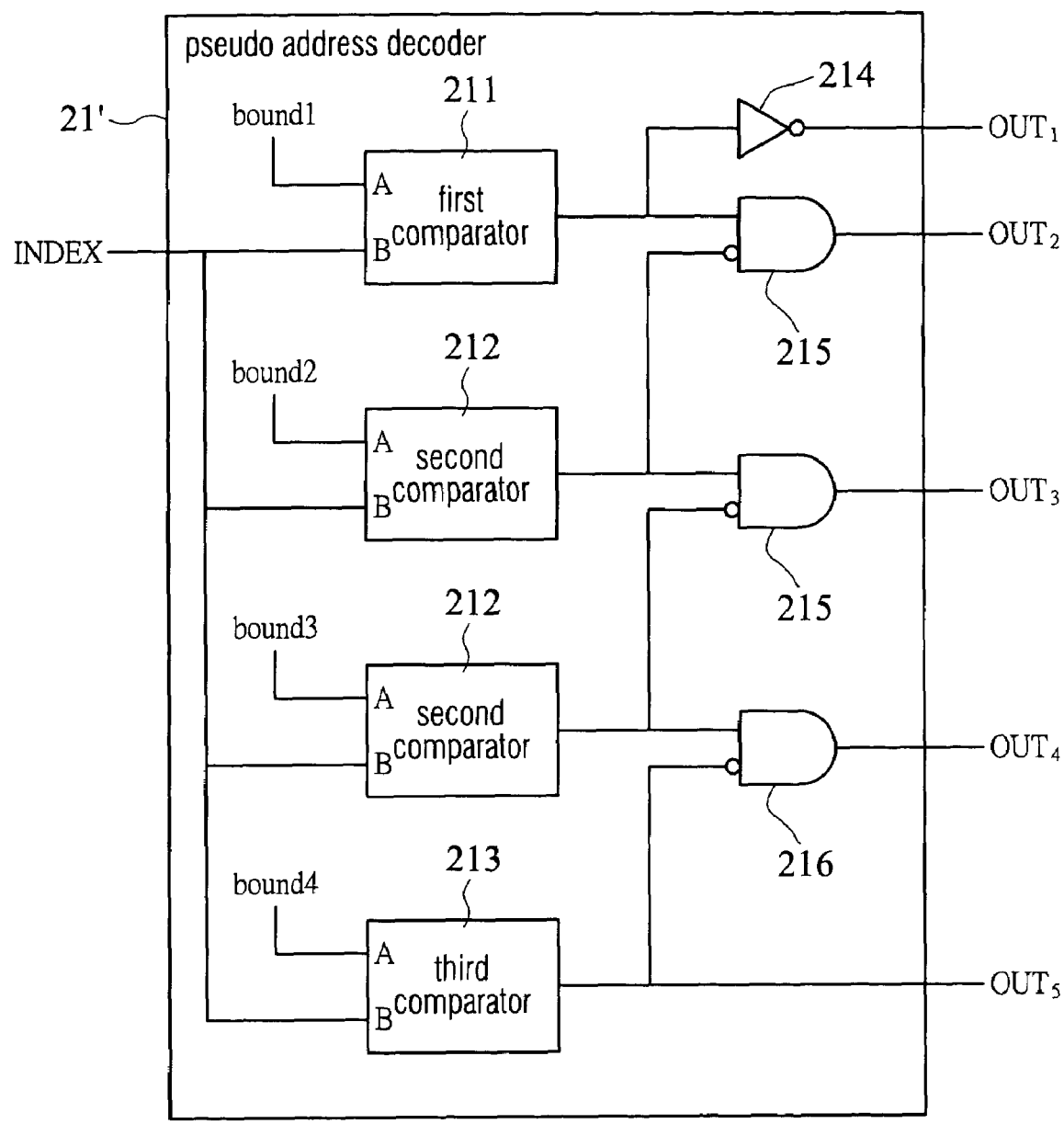
FIG. 4 is a circuit diagram showing another example of a pseudo address decoder of an apparatus for recording compression encoding tables in a pseudo read-only memory as illustrated by the preferred embodiment of the invention.

The aforesaid examples and the aforesaid embodiment are only illustrative and are not to be construed as limiting the invention. Anyone skilled in the art may modify the aforesaid embodiment without departing from the true spirit and scope of the invention. For instance, in this embodiment the compression encoding table is divided into four blocks, namely B1, B2, B3 and B4, as shown in FIG. 5, but a person who is skilled in the art may otherwise partition the compression encoding table in the following way. As shown in FIG. 4, the pseudo address decoder 21' further includes a second comparator 212 and a second AND gate 216. The related connections are modified to generate five output values, thereby dividing the compression encoding table into five blocks. This explains that the number of blocks into which a compression encoding table is partitioned depends on the number of comparators.

Also, discrete blocks may be modified by altering the way a symbol is denoted. For example, assume the block B3 is denoted by <403, REP, 11> and <403, INC, 0> wherein the initial value of the index for the block B3 is 403 (which is the original index, i.e., the value of the field Index in FIG. 5). As indicated by the calculated actual data values, the value of the field |Level| with repeating feature remains 11 for the data whose original index is 404. The value of the field Zero Run with the increasing feature may be obtained through the following equation, which is a modified version of equation (a):

$$VALUE_{INC}=INDEX_{current}-INDEX_{init}+LEVEL$$

where $INDEX_{current}$ denotes the index for calculating the corresponding actual value, $INDEX_{init}$ denotes the initial value of index for the symbol, and LEVEL denotes the block initial value for the symbol. As a result, the value of the field Zero Run for an original index of 404 is 1 (404−403+0).

What is claimed is:

1. A method of recording a compression encoding table in a pseudo read-only memory, capable of reducing storage space, which is implemented in a recording environment comprising a logic circuit, a storage element, and the data values of the compression encoding table being repeating or increasing, the method comprising:

dividing the compression encoding table into a plurality of blocks, according to the repeating or increasing data values of the compression encoding table;
   calculating the repeating or increasing data values of each of the blocks by using the logic circuit; and
   storing non-repeating or non-increasing data values of the compression encoding table in the storage element.

2. The method according to claim 1, wherein the storage element is a read-only memory.

3. The method according to claim 1, wherein each of the blocks with the repeating data values is denoted by a repeat symbol <REP, LEVEL.sub.REP, COUNT.sub.REP> where the REP denotes the repeating feature of the repeat symbol, the LEVEL.sub.REP denotes the repeating data values of the block, and the COUNT.sub.REP denotes a data count of the block.

4. The method according to claim 3, wherein each of the blocks with the increasing data values is denoted by an increase symbol <1NC, LEVEL.sub.INC, COUNT.sub.INC> where the INC denotes the increasing feature of the increase symbol, the LEVEL.sub.INC denotes the initial value for the increasing data value of the block, and the COUNT.sub.INC denotes the data count of the block.

5. The method according to claim 4, wherein the step of calculating the repeating or increasing data values of each of the blocks by using a logic circuit includes:

obtaining the repeating data values, which are equal to the values of the LEVEL.sub.REP of the repeat symbol;
   obtaining the increasing data values by the following equation:

VALUE.sub.INC=INDEX−SUM.sub.COUNT+ LEVEL where the VALUE.sub.INC denotes the increasing values, the INDEX denotes the index set for each datum by the compression encoding table, one by one starting from an initial index of 0, the SUM.sub.COUNT denotes a data count of all the blocks that precede the located block, and the LEVEL denotes the value of LEVEL.sub.INC of the increase symbol.

6. An apparatus of recording a compression encoding table in a pseudo read-only memory, the compression encoding table setting an index for each datum, one by one starting from an initial index of 0, the data values of the compression encoding table being repeating or increasing, the compression encoding table being divided into a plurality of blocks according to the repeating or increasing data values, each of the blocks being denoted by a property symbol <OP, LEVEL, COUNT> wherein the OP denotes repeating or increasing, the LEVEL denotes initial values of the blocks, the COUNT denotes data counts of the blocks; the apparatus comprising:

a pseudo address decoder for determining the block, to which the index corresponds, by the index and generating a plurality of output values;
   a programmable logic array for calculating and outputting, on the basis of the output values of the pseudo address decoder, an initial value of the property symbol of the block in which the index is located, and a data count of all the blocks that precedes the block; and
   a corresponding value calculation module for calculating the values of the compression encoding table corresponding to the index on the basis of the output values of the programmable logic array.

7. The apparatus according to claim 6, further comprising:
   a storage element for storing non-repeating or non-increasing data of the compression encoding table, and a first multiplexer for selectively outputting the output values calculated by the corresponding value calculation module or the data read from the storage element.

8. The apparatus according to claim 7, wherein the storage element is a read-only memory.

9. The apparatus according to claim 7, wherein if the block in which the index is located is not calculated by the programmable logic array, then the first multiplexer outputs the data read from the storage element, otherwise the programmable logic array outputs the output values calculated by the corresponding value calculation module.

10. The apparatus according to claim 6, wherein the pseudo address decoder includes:
- at least one comparator with terminals A and B, the terminal A receiving a block bound value, which is a maximum index of the block, and the terminal B receiving the index, wherein if the input to the terminal B is greater than the input to the terminal A, then the at least one comparator outputs 1, otherwise the at least one comparator outputs 0, thereby determining the block in which the index is located;
- at least one inverter for inverting one of the output values of the comparator; and
- at least one AND gate with one input terminal receiving the output of one of two adjacent comparators of the at least one comparator and another input terminal receiving the inverted output of another of the two adjacent comparator.

11. The apparatus according to claim 6, wherein the corresponding value calculation module includes:
- a first subtracter for outputting a first difference between the index and the data count; an adder for summing the first difference and the initial value of the located block and outputting a increasing value; and
- a second multiplexer for selectively outputting the symbol initial value output by the programmable logic array or output the increasing value output by the adder.

12. The apparatus according to claim 11, wherein if the symbol output by the programmable logic array is a repeat symbol, then the second multiplexer outputs the symbol initial value output by the programmable logic array, and if the symbol output by the programmable logic array is an increase symbol, then the second multiplexer outputs the increasing value output by the adder.

13. The apparatus according to claim 6, further comprising:
- a second subtracter for outputting a second difference between the index and an address offset, wherein the data of the compression encoding table stored in the storage element is read on the basis of the second difference.

* * * * *